United States Patent
Chang (10) Patent No.: US 9,105,813 B1
(45) Date of Patent: Aug. 11, 2015

(54) MICRO-LIGHT-EMITTING DIODE

(71) Applicant: MIKRO MESA TECHNOLOGY CO., LTD., Apia (WS)

(72) Inventor: Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/290,999

(22) Filed: May 30, 2014

(51) Int. Cl.
*H01L 33/38* (2010.01)
*H01L 33/44* (2010.01)
*H01L 33/20* (2010.01)

(52) U.S. Cl.
CPC ............. *H01L 33/38* (2013.01); *H01L 33/20* (2013.01); *H01L 33/44* (2013.01)

(58) Field of Classification Search
CPC .......... H01L 33/38; H01L 33/44; H01L 33/20
See application file for complete search history.

(56) References Cited

U.S. PATENT DOCUMENTS

| | | | |
|---|---|---|---|
| 6,410,942 B1 * | 6/2002 | Thibeault et al. | 257/88 |
| 2006/0169993 A1 * | 8/2006 | Fan et al. | 257/88 |
| 2013/0126081 A1 * | 5/2013 | Hu et al. | 156/249 |

* cited by examiner

*Primary Examiner* — Richard Booth
(74) *Attorney, Agent, or Firm* — CKC & Partners Co., Ltd.

(57) ABSTRACT

A micro-light-emitting diode (micro-LED) includes a first type semiconductor layer, a second type semiconductor, a first dielectric layer, and a first electrode. The second type semiconductor layer is disposed on or above the first type semiconductor layer. The first dielectric layer is disposed on the second type semiconductor layer. The first dielectric layer has at least one opening therein to expose at least one part of the second type semiconductor layer. A first shortest distance between an edge of the opening of the first dielectric layer and a side surface of the second type semiconductor layer is greater than or equal to 1 μm. The first electrode is partially disposed on the first dielectric layer and is electrically coupled with the exposed part of the second type semiconductor layer through the opening of the first dielectric layer.

20 Claims, 6 Drawing Sheets

MICRO-LIGHT-EMITTING DIODE

BACKGROUND

1. Technical Field

The present disclosure relates to micro-light-emitting diodes (micro-LEDs).

2. Description of Related Art

In the recent years, light-emitting diodes (LEDs) have become popular in general and commercial lighting applications. As light sources, LEDs have many advantages including lower energy consumption, longer lifetime, smaller size, and faster switching, and hence conventional lighting, such as incandescent lighting, is gradually replaced by LED lights.

In an LED, when electrons and holes recombine across the semiconductor gap, the recombination energy is emitted in the form of photons and generates light. This recombination mechanism is the so-called radiative recombination. However, when electrons and holes recombine through intermediate electronic states in the semiconductor gap, then the recombination energy is emitted in the form of heat instead of photons, reducing the light emission efficiency of the LED. This recombination mechanism is the so-called non-radiative recombination. On the side surface of an LED, typically there are a large number of surface and defect states. Therefore, a fraction of electrons and holes that are close to the side surface of the LED will non-radiatively recombine through these surface and defect states. This non-radiative recombination generates heat instead of light, considerably reducing the efficiency of the LED. This problem becomes more and more serious as miniaturization of LEDs proceeds to microscale since electrons and holes can spread to the side surface easily in a micro-LED.

Furthermore, since electrons and holes can spread to the side surface easily in a micro-LED, the current density may be too low and uneven within the emitting area of the micro-LED. The low and uneven current density within the emitting area of the micro-LED reduces the efficiency of the micro-LED as well.

Moreover, typically there are a large number of lattice defects in the side surface of an LED due to the etching and/or scribing process. These lattice defects result in leakage currents. As miniaturization of LEDs proceeds to microscale, the ratio of the lattice defects to the lattice sites of a micro-LED increases, thereby raising the ratio of the leakage currents to the total currents of the micro-LED and reducing the efficiency of the micro-LED.

Furthermore, as miniaturization of LEDs proceeds to microscale, the process variation tolerance of micro-LEDs decreases, and therefore the yield rate of micro-LEDs decreases. In addition, transferring, controlling, operating, and handling of micro-LEDs also become more and more difficult.

SUMMARY

According to one embodiment of this invention, a micro-light-emitting diode (micro-LED) includes a first type semiconductor layer, a second type semiconductor, a first dielectric layer, and a first electrode. The second type semiconductor layer is disposed on or above the first type semiconductor layer. The first dielectric layer is disposed on the second type semiconductor layer. The first dielectric layer has at least one opening therein to expose at least one part of the second type semiconductor layer. A first shortest distance between an edge of the opening of the first dielectric layer and a side surface of the second type semiconductor layer is greater than or equal to 1 μm. The first electrode is partially disposed on the first dielectric layer and is electrically coupled with the exposed part of the second type semiconductor layer through the opening of the first dielectric layer.

The opening defines the contact interface between the first electrode and the second type semiconductor layer. When the micro-LED is forward biased, charge carriers flow from the contact interface between the first electrode and the second type semiconductor layer to the junction of the first type semiconductor layer and the second type semiconductor layer. Since the first shortest distance is greater than or equal to 1 μm, charge carriers spreading to the side surface of the micro-LED are rare or none. Therefore, the non-radiative recombination occurring at the side surface of the micro-LED can be reduced, thereby increasing the efficiency of the micro-LED.

Furthermore, since the opening limits the area where the current goes into the micro-LED, the current density within the emitting area of the micro-LED increases and can be more uniform, thereby increasing the efficiency of the micro-LED.

Moreover, since charge carriers spreading to the side surface of the micro-LED are rare or none, the leakage currents of the micro-LED can be reduced regardless of the lattice defects in the side surface of the micro-LED.

Furthermore, since the opening makes the emitting area of the micro-LED smaller than the size of the micro-LED, it is possible to continue miniaturization of the emitting area of the micro-LED while remain the size of the micro-LED to allow the micro-LED to be manufactured with acceptable yield rate. In addition, the micro-LED with a larger size has a considerably lower electrostatic sensitivity, a considerably lower surface leakage current, and a considerably lower side surface leakage current due to the lattice defects.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
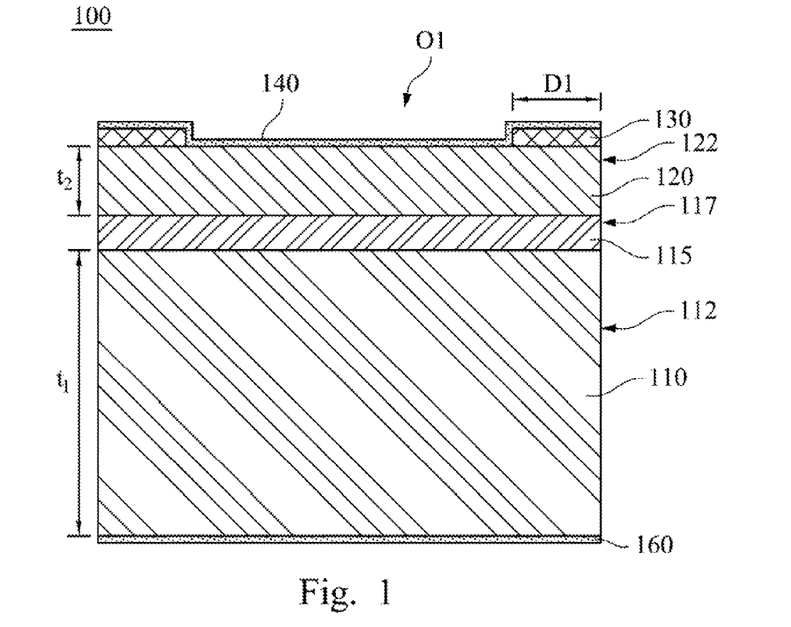
FIG. 1 is a cross-sectional view of a micro-light-emitting diode micro-LED) according to the first embodiment of this invention.

FIG. 1 is a cross-sectional view of a micro-light-emitting diode (micro-LED) 100 according to the first embodiment of this invention. The micro-LED 100 includes a first type semiconductor layer 110, an active layer 115, a second type semiconductor layer 120, a first dielectric layer 130, and a first electrode 140. The second type semiconductor layer 120 is disposed above the first type semiconductor layer 110. The active layer 115 is disposed between the first type semiconductor layer 110 and the second type semiconductor layer 120. The first dielectric layer 130 is disposed on the second type semiconductor layer 120. The first dielectric layer 130 has at least one opening O1 therein to expose at least one part of the second type semiconductor layer 120. A first shortest distance D1 between an edge of the opening O1 and a side surface 122 of the second type semiconductor layer 120 is greater than or equal to 1 μm. The first electrode 140 is partially disposed on the first dielectric layer 130 and is electrically coupled with the exposed part of the second type semiconductor layer 120 through the opening O1.

As shown in FIG. 1, the opening O1 defines the contact interface between the first electrode 140 and the second type semiconductor layer 120. When the micro-LED 100 is forward biased, charge carriers flow from the contact interface between the first electrode 140 and the second type semiconductor layer 120 to the active layer 115. Since the first shortest distance D1 is greater than or equal to 1 μm, charge carriers spreading to the side surface 122 and/or a side surface 117 of the active area 115 are rare or none. Therefore, the non-radiative recombination occurring at the side surface 117 can be reduced, thereby increasing the efficiency of the micro-LED 100.

Furthermore, since the opening O1 limits the area where the current goes into the micro-LED 100, the current density within the emitting area of the micro-LED 100 increases and can be uniform, thereby increasing the efficiency of the micro-LED 100.

Moreover, since charge carriers spreading to the side surface 122 and/or the side surface 117 are rare or none, the leakage currents of the micro-LED 100 can be reduced regardless of the lattice defects in the side surface 122 and/or the side surface 117.

Furthermore, since the opening O1 makes the emitting area of the micro-LED 100 smaller than the size of the micro-LED 100, it is possible to continue miniaturization of the emitting area of the micro-LED 100 while remain the size of the micro-LED 100 to allow the micro-LED 100 to be manufactured with acceptable yield rate. For example, a 20 μm×20 μm micro-LED 100 with a 2 μm×2 μm opening can perform the same light output characteristics as a conventional 2 μm×2 μm micro-LED. In addition, the micro-LED 100 with a larger size has a considerably lower electrostatic sensitivity, a considerably lower surface leakage current, and a considerably lower side surface leakage current due to the lattice defects.

In some embodiments, the size of the micro-LED 100 is smaller than 100 μm×100 μm or 0.01 mm².

In some embodiments, a geometric weighted mean distance between the side surface of the opening O1 and the side surface 122 is greater than or equal to 1 μm. Furthermore, the area of the opening O1 viewed in a direction normal to the first dielectric layer 130 occupies 2.5%-90% of the total area of the first dielectric layer 130 viewed in the direction normal to the first dielectric layer 130. If the area of the opening O1 occupies less than 2.5% of the total area of the first dielectric layer 130, the opening O1 may be too small, and therefore a complex photolithography process may be needed. If the area of the opening O1 occupies greater than 90% of the total area of the first dielectric layer 130, the first shortest distance D1 may be less than 1 m, thereby allowing charge carriers to spread to the side surface 122 and/or the side surface 117.

In some embodiments, the current spreading length of the second type semiconductor layer 120 is less than the current spreading length of the first type semiconductor layer 110. That is, the current spreading length of the first type semiconductor layer 110 is greater than the current spreading length of the second type semiconductor layer 120. In some embodiments, the current spreading length of the first type semiconductor layer 110 is over 20 times greater than the current spreading length of the second type semiconductor layer 120. In this configuration, charge carriers in the second type semiconductor layer 120 are more difficult to spread to the side surface 122 and/or the side surface 117. Therefore, the non-radiative recombination occurring at the side surface 117 can be further reduced, thereby further increasing the efficiency of the micro-LED 100.

The current spreading length of a semiconductor layer of a diode is determined by the following equation I:

$$L_s = \sqrt{\frac{n_{ideal}KT}{\rho J_0 e}} \qquad \text{Equation 1}$$

, where $L_s$ is the current spreading length of the semiconductor layer of the diode, t is the thickness of the semiconductor layer, $n_{ideal}$ is the ideality factor of the diode, K is the Boltzmann constant, T is the temperature of the semiconductor layer in Kelvin, $\rho$ is the resistance of the semiconductor layer, $J_0$ is the current density at the interface between the semiconductor layer and a electrode of the diode, and e is the charge of a proton.

As confirmed by the aforementioned equation I, the current spreading length of the semiconductor layer of the diode is proportional to $$\sqrt{\frac{t}{\rho}}.$$

Therefore, in some embodiments, the first type semiconductor layer 110 has a resistance $\rho_1$ and a thickness $t_1$, the second type semiconductor layer 120 has a resistance $\rho_2$ and a thickness $t_2$, and $$\sqrt{\frac{t_2}{\rho_2}} < \sqrt{\frac{t_1}{\rho_1}}$$

to make the current spreading length of the second type semiconductor layer 120 to be less than the current spreading length of the first type semiconductor layer 110. In some embodiments, the first type semiconductor layer 110 is an a type semiconductor layer, and the second type semiconductor layer 120 is a p type semiconductor layer.

In addition, the IV curve for a conventional micro-LED has a steep slope of the forward current versus the forward voltage especially in the mid/low power region near the threshold. This steep slope makes it difficult to control the forward current, and thus the luminance of the conventional micro-LED cannot be easily controlled.

Therefore, in some embodiments, the first dielectric layer 130 with the opening O1 is disposed on the second type semiconductor layer 120, which has a short current spreading length. Since the second type semiconductor layer 120 has the short current spreading length, the second type semiconductor layer 120 has high resistance and is thin in thickness. In this configuration, the serial resistance of the micro-LED 100 increases, thereby making the slope of the forward current versus the forward voltage gentle. This gentle slope makes it easier to control the forward current, and thus the luminance of the micro-LED 100 can be more easily controlled.

In some embodiments, the first type semiconductor layer 110 is made of, for example, n-doped GaN:Si. The thickness of the first type semiconductor layer 110 is in a range from 0.1 µm to 50 µm. The first type semiconductor layer 110 is formed by, for example, epitaxy.

The micro-LED 100 of FIG. 1 may further include a second electrode 160. The second electrode 160 is at least partially disposed on the first type semiconductor layer 110, such that the first type semiconductor layer 110, the active layer 115, and the second type semiconductor layer 120 are disposed between the first electrode 140 and the second electrode 160. The second electrode 160 is electrically coupled with the first type semiconductor layer 110. Both the first electrode 140 and the second electrode 160 are made of a conductive material, such as metal or a transparent conductive material, e.g. indium tin oxide (ITO). The first electrode 140 and the second electrode 160 can be formed by, for example, physical vapor deposition (PVD) or chemical vapor deposition (CVD).

In some embodiments, the first type semiconductor layer 110 may include an optional ohm contact layer to reduce the contact resistance between the second electrode 160 and the first type semiconductor layer 110. In some embodiments, the ohm contact layer and the rest of the first type semiconductor layer 110 are made of, for example, n-doped GaN:Si, while the ohm contact layer is doped more heavily than the rest of the first type semiconductor layer 110. The thickness of the ohm contact layer is in a range from 5 nm to 2 µm. The thickness of the rest of the first type semiconductor layer 110 is in a range from 0.1 µm to 50 µm.

In some embodiments, the second type semiconductor layer 120 is made of, for example, p-doped GaN or p-doped AlGaInP. The thickness of the second type semiconductor layer 120 is in a range from 50 am to 20 µm. The second type semiconductor layer 120 is formed by, for example, epitaxy.

Similarly, the second type semiconductor layer 120 may include an optional ohm contact layer to reduce the contact resistance between the first electrode 140 and the second type semiconductor layer 120. In some embodiments, the ohm contact layer and the rest of the second type semiconductor layer 120 are made of, for example, p-doped GaN or p-doped AlGaInP, while the ohm contact layer is doped more heavily than the rest of the second type semiconductor layer 120. Alternatively, the ohm contact layer is made of, for example, InGaN, and the rest of the second type semiconductor layer 120 is made of, for example, p-doped GaN or p-doped AlGaInP. The thickness of the ohm contact layer is in a range from 5 nm to 2 µm. The thickness of the rest of the second type semiconductor layer 120 is in a range from 50 nm to 20 µm.

In some embodiments, the active layer 115 is made of, for example, heterostructure or quantum well structure. The thickness of the active layer 115 is in a range from 50 nm to 5 µm. The active layer 115 is formed by, for example, epitaxy.

In some embodiments, the active layer 115 can be omitted. In the case that the active layer 115 is omitted, the second type semiconductor layer 120 is disposed on the first type semiconductor layer 110.

In some embodiments, the first dielectric layer 130 is made of a dielectric material, such as silicon nitride or silicon dioxide. The thickness of the first dielectric layer 130 is in a range from 10 nm to 5 µm. The first dielectric layer 130 is formed by, for example, physical vapor deposition (PVD).

In some embodiments, a combination of the first type semiconductor layer 110, the active layer 115, the second type semiconductor layer 120, and the first dielectric layer 130 with the opening O1 is a solid with at least two planes. For example, the combination of the first type semiconductor layer 110, the active layer 115, the second type semiconductor layer 120 and the first dielectric layer 130 with the opening O1 is a cylinder, a polyhedron, or a trapezoidal solid.

Figure 2:
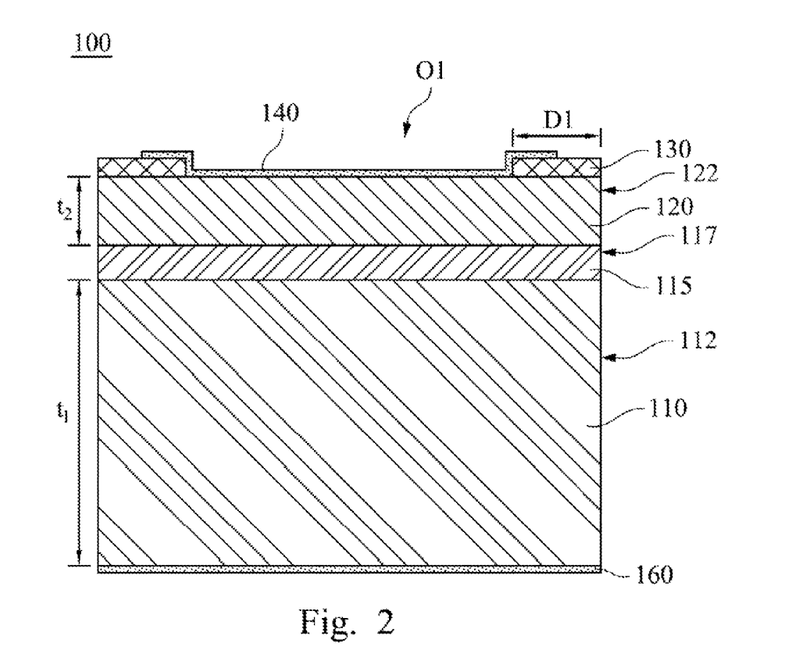
FIG. 2 is a cross-sectional view of a micro-LED according to the second embodiment of this invention.

FIG. 2 is a cross-sectional view of a micro-LED 100 according to the second embodiment of this invention. The difference between this embodiment and the first embodiment is that the first electrode 140 of FIG. 2 partially covers the upper surface of the first dielectric layer 130, while the first electrode 140 of FIG. 1 fully covers the upper surface of the first dielectric layer 130.

Other details regarding the micro-LED 100 of FIG. 2 are similar to the micro-LED 100 of FIG. 1 and therefore are not repeated here to avoid duplicity.

Figure 3:
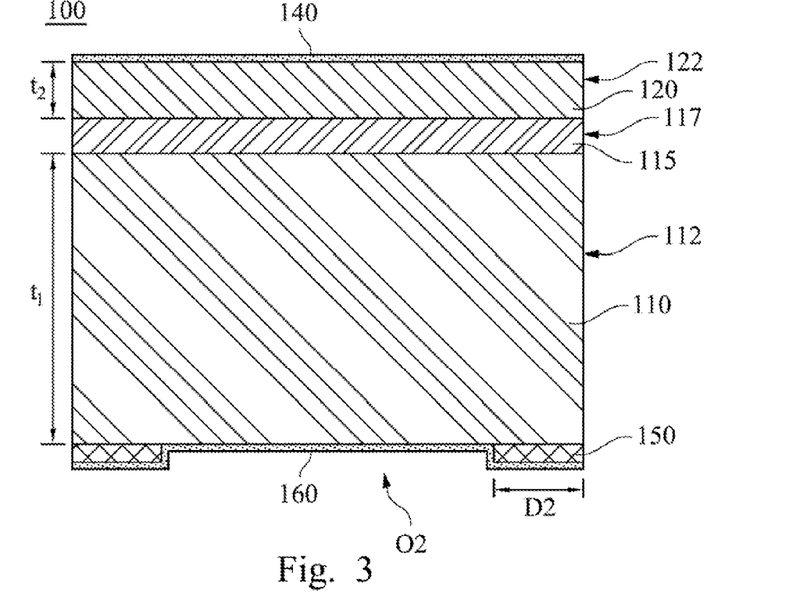
FIG. 3 is a cross-sectional view of a micro-LED according to the third embodiment of this invention.

FIG. 3 is a cross-sectional view of a micro-LED 100 according to the third embodiment of this invention. The difference between this embodiment and the first embodiment is that the micro-LED 100 further includes a second dielectric layer 150, while the first dielectric layer 130 is omitted. The second dielectric layer 150 is disposed on the first type semiconductor layer 110. The second dielectric layer 150 has at least one opening O2 therein to expose at least one part of the first type semiconductor layer 110. A second shortest distance D2 between an edge of the opening O2 and a side surface 112 of the first type semiconductor layer 110 is greater than or equal to 1 µm. The second electrode 160 is partially disposed on the second dielectric layer 150 and is electrically coupled with the exposed part of the first type semiconductor layer 110 through the opening O2.

Similarly, due to the opening O2, charge carriers spreading to the side surface 112 and/or the side surface 117 are rare or none, thereby reducing the non-radiative recombination occurring at the side surface 117. In the case that the current spreading length of the first type semiconductor layer 110 is not over 20 times greater than the current spreading length of the second type semiconductor layer 120, the first dielectric layer 130 with the opening O1 can be replaced by the second dielectric layer 150 with the opening O2 to reduce the non-radiative recombination occurring at the side surface 117. Other details regarding the second dielectric layer 150 with the opening O2 are similar to the first dielectric layer 130 with the opening O1.

Other details regarding the micro-LED 100 of FIG. 3 are similar to the micro-LED 100 of FIG. 1 and therefore are not repeated here to avoid duplicity.

Figure 4:
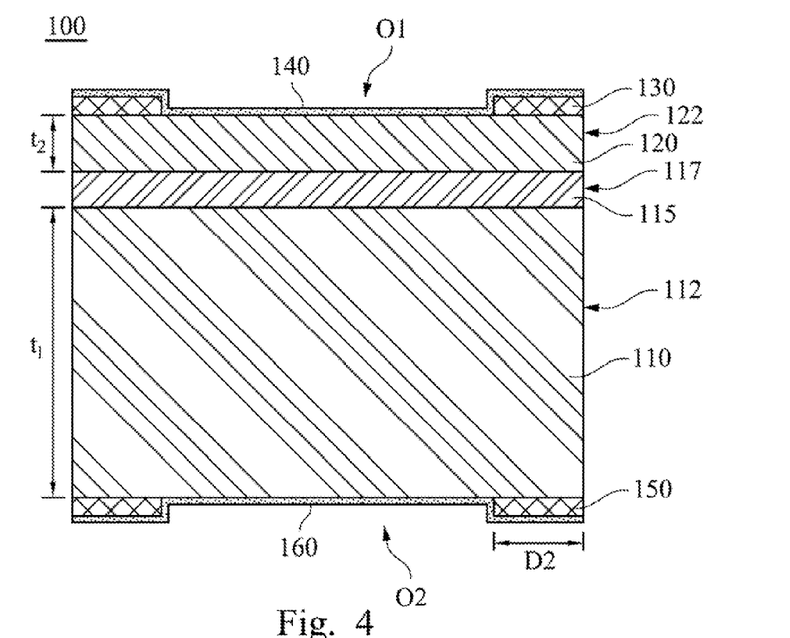
FIG. 4 is a cross-sectional view of a micro-LED according to the forth embodiment of this invention.

FIG. 4 is a cross-sectional view of a micro-LED 100 according to the forth embodiment of this invention. The difference between this embodiment and the first or third embodiment is that the micro-LED 100 of FIG. 4 includes both the first dielectric layer 130 with the opening O1 and the second' dielectric layer 150 with the opening O2.

Other details regarding the micro-LED 100 of FIG. 4 are similar to the micro-LEDs 100 of FIGS. 1 and 3 and therefore are not repeated here to avoid duplicity.

Figure 5:
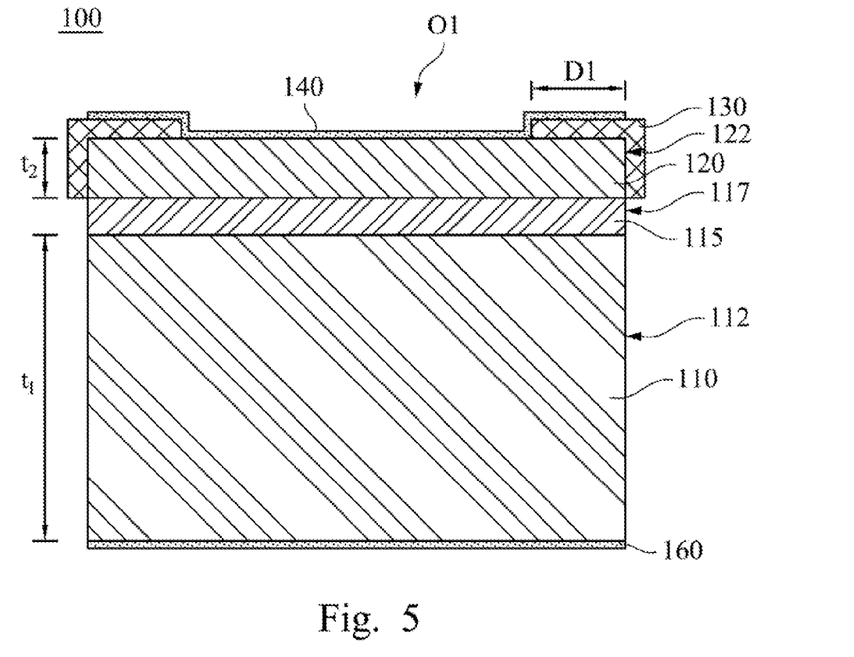
FIG. 5 is a cross-sectional', view of a micro-LED according to the fifth embodiment of this invention.

FIG. 5 is a cross-sectional view of a micro-LED 100 according to the fifth embodiment of this invention. Similar to the first dielectric layer 130 of FIG. 1, the first dielectric layer 130 of FIG. 5 partially cover a major surface of the second type semiconductor layer 120 distal to the first type semiconductor layer 110. The difference between the first dielectric layer 130 of FIG. 5 and the first dielectric layer 130 of FIG. 1 is that the first dielectric layer 130 of FIG. 5 further at least partially covers the side surface 122. In this configuration, the side surface 122 can be protected from moisture and mechanical damage by the first dielectric layer 130.

Other details regarding the micro-LED 100 of FIG. 5 are similar to the micro-LED 100 of FIG. 1 and therefore are not repeated here to avoid duplicity.

Figure 6:
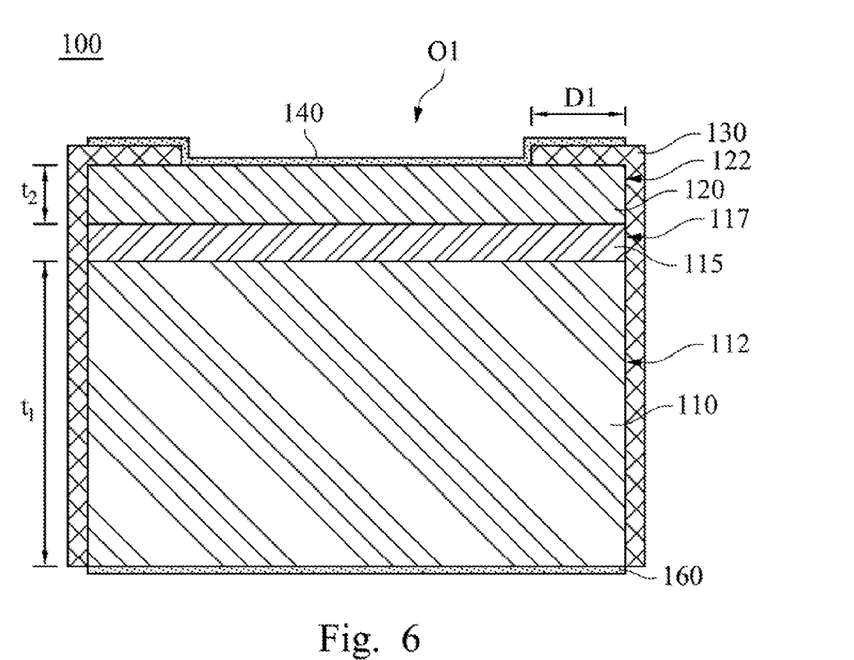
FIG. 6 is a cross-sectional view of a micro-LED according to the sixth embodiment of this invention.

FIG. 6 is a cross-sectional view of a micro-LED 100 according to the sixth embodiment of this invention. The difference between the first dielectric layer 130 of FIG. 6 and the first dielectric layer 130 of FIG. 5 is that the first dielectric layer 130 of FIG. 6 further at least partially covers the side surface 117 and/or the side surface 112. In this configuration, the side surface 117 and/or the side surface 112 can be protected from moisture and mechanical damage by the first dielectric layer 130.

Other details regarding the micro-LED 100 of FIG. 6 are similar to the micro-LED 100 of FIG. 5 and therefore are not repeated here to avoid duplicity.

Figure 7:
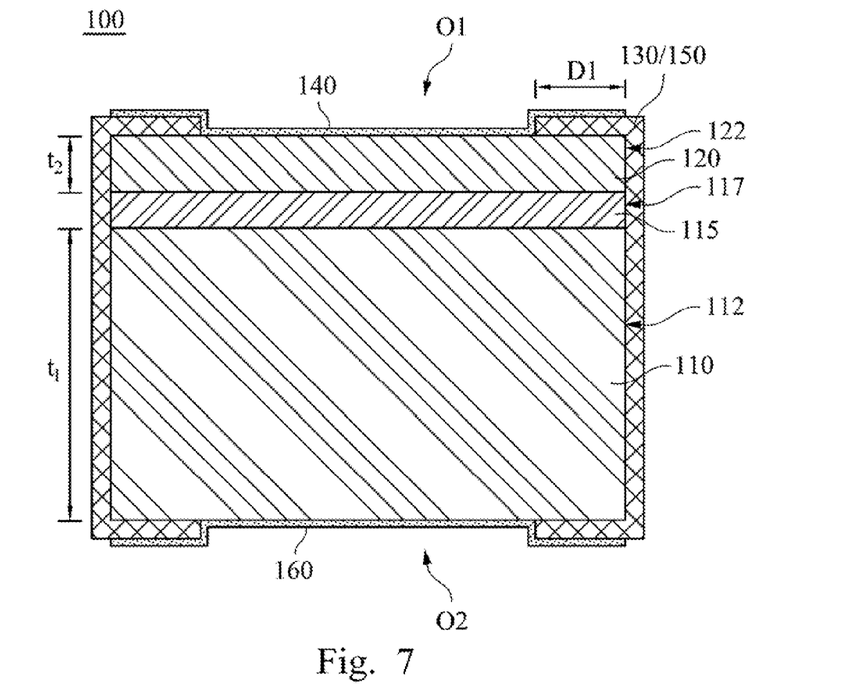
FIG. 7 is a cross-sectional view of a micro-LED according to the seventh embodiment of this invention.

FIG. 7 is a cross-sectional view of a micro-LED 100 according to the seventh embodiment of this invention. The difference between the first and second dielectric layers 130/150 of FIG. 7 and the first and second dielectric layers 130/150 of FIG. 4 is that the first and second dielectric layers 130/150 of FIG. 7 further at least partially covers the side surface 122, the side surface 117, and/or the side surface 112. In this configuration, the side surface 122, the side surface 117, and/or the side surface 112 can be protected from moisture and mechanical damage by the first and second dielectric layers 130/150.

Other details regarding the micro-LED 100 of FIG. 7 are similar to the micro-LED 100 of FIG. 4 and therefore are not repeated here to avoid duplicity.

Figure 8:
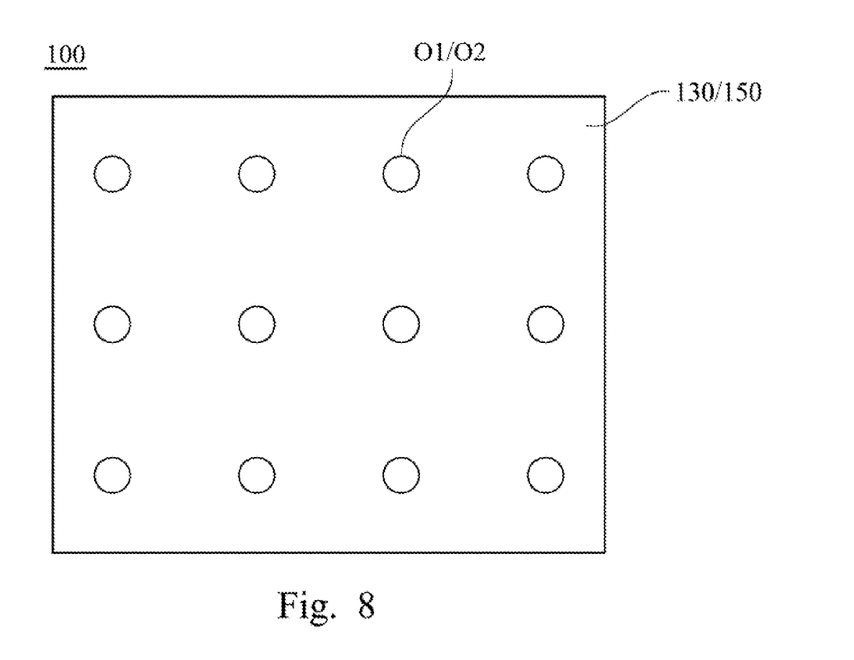
FIG. 8 is a plan view of a micro-LED according to the eighth embodiment of this invention, wherein the first or second electrode is removed.

FIG. 8 is a plan view of a micro-LED 100 according to the eighth embodiment of this invention, wherein the first or second electrode 140 or 160 is removed. As shown in FIG. 8, the first or second dielectric layer 130 or 150 has a plurality of the openings O1 or O2 therein. The number of the openings O1 or O2 is in a range from 1 to 1000. The openings O1 or O2 are arranged in an array, and the openings O1 or O2 have the same shape. More specifically, the openings O1 or O2 of FIG. 8 are circular in shape.

Other details regarding the micro-LED 100 of FIG. 8 are similar to the micro-LED 100 of FIG. 1 and therefore are not repeated here to avoid duplicity.

Figure 9:
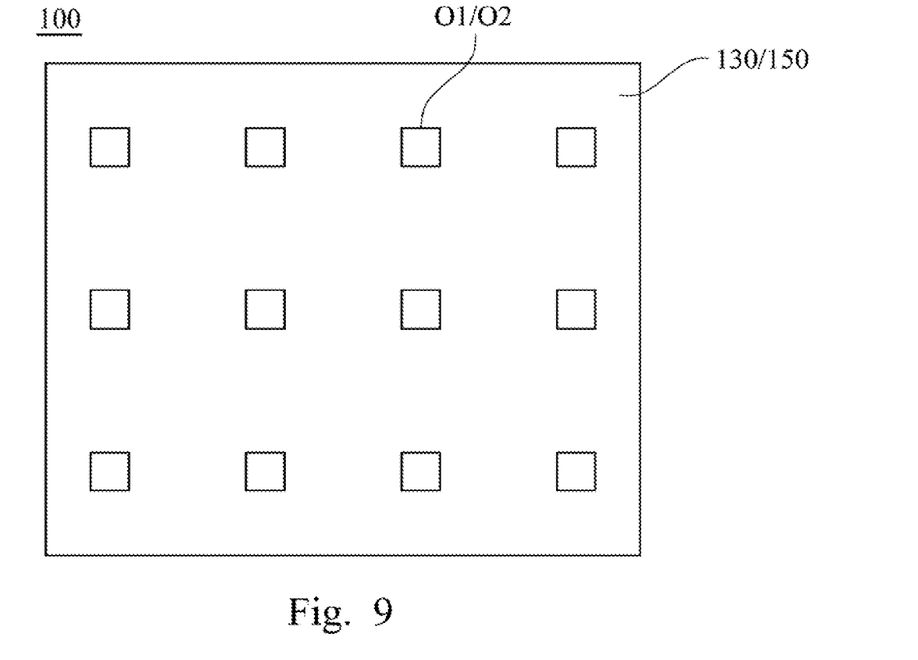
FIG. 9 is a plan view of a micro-LED according to the ninth embodiment of this invention, wherein the first or second electrode is removed.

FIG. 9 is a plan view of a micro-LED 100 according to the ninth embodiment of this invention, wherein the first or second electrode 140 or 160 is removed. The difference between the micro-LED 100 of FIG. 9 and the micro-LED 100 of FIG. 8 is that the openings O1 or O2 of FIG. 9 are rectangular in shape.

Other details regarding the micro-LED 100 of FIG. 9 are similar to the micro-LED 100 of FIG. 9 and therefore are not repeated here to avoid duplicity.

Figure 10:
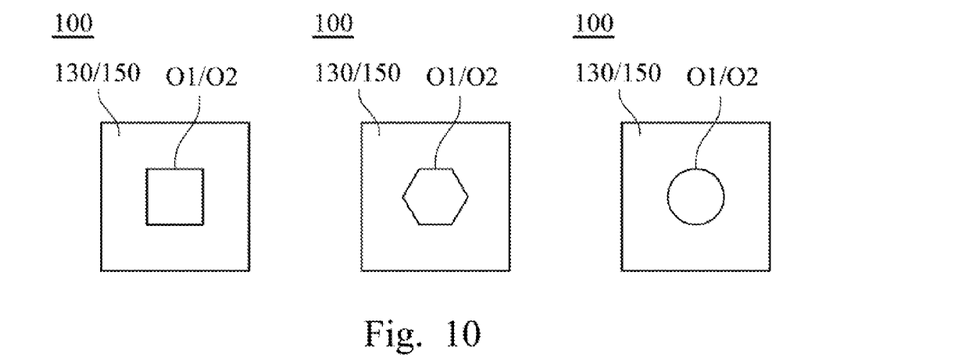
FIG. 10 is a plan view of a plurality of micro-LEDs according to the tenth embodiment of this invention, wherein the first or second electrodes are removed.

FIG. 10 is a plan view of a plurality of micro-LEDs 100 according to the tenth embodiment of this invention, wherein the first or second electrodes 140 or 160 are removed. As shown in FIG. 10, the micro-LEDs 100 are arranged in an array. The micro-LEDs 100 have the same shape, while the openings O1 or O2 have different shapes.

Other details regarding the micro-LEDs 100 of FIG. 10 are similar to the micro-LED 100 of FIG. 1 and therefore are not repeated here to avoid duplicity.

Figure 11:
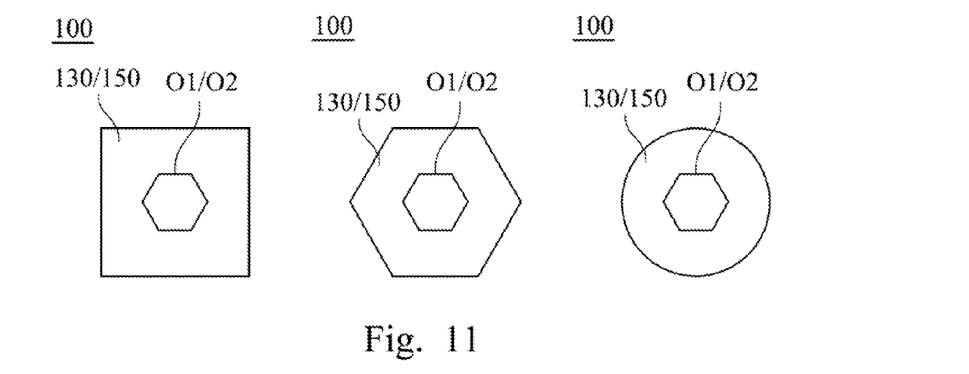
FIG. 11 is a plan view of a plurality of micro-LEDs according to the eleventh embodiment of this invention, wherein the first or second electrodes are removed.

FIG. 11 is a plan view of a plurality of micro-LEDs 100 according to the eleventh embodiment of this invention, wherein the first or second electrodes 140 or 160 are removed. As shown in FIG. 11, the micro-LEDs 100 are arranged in an array. The micro-LEDs 100 have different shapes, while the openings O1 or O2 have the same shape.

Other details regarding the micro-LEDs 100 of FIG. 11 are similar to the micro-LEDs 100 of FIG. 10 and therefore are not repeated here to avoid duplicity.

Figure 12:
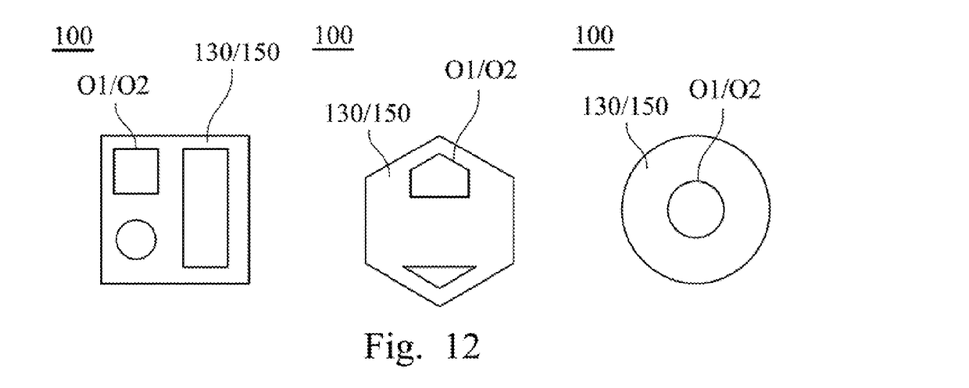
FIG. 12 is a plan view of a plurality of micro-LEDs according to the twelfth embodiment of this invention, wherein the first or second electrodes are removed.

FIG. 12 is a plan view of a plurality of micro-LEDs 100 according to the twelfth embodiment of this invention, wherein the first or second electrodes 140 or 160 are removed. As shown in FIG. 12, the micro-LEDs 100 are arranged' in an array. The micro-LEDs 100 have different shapes, and the openings O1 or O2 have different shapes as well. That is, the openings O1 or O2 for any one of the micro-LEDs 100 are different from the openings O1 or O2 for any other of the micro-LEDs 100. Furthermore, the openings O1 or O2 for each micro-LED 100 also have different shapes, i.e. are different from each other. As shown in FIG. 12, the number of the openings O1 or O2 for each micro-LED 100 is one, two, or three, and the openings O1 or O2 can be circular or polygonal in shape.

Other details regarding the micro-LEDs 100 of FIG. 12 are similar to the micro-LEDs 100 of FIG. 11 and therefore are not repeated here to avoid duplicity.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A micro-light-emitting diode (micro-LED), comprising:
    a first type semiconductor layer;
    a second type semiconductor layer disposed on or above the first type semiconductor layer;
    a first dielectric layer disposed on the second type semiconductor layer, the first dielectric layer having at least one opening therein to expose at least one part of the second type semiconductor layer, wherein a first shortest distance between an edge of the opening of the first dielectric layer and a side surface of the second type semiconductor layer is greater than or equal to 1 µm; and
    a first electrode partially disposed on the first dielectric layer and electrically coupled with the exposed part of the second type semiconductor layer through the opening of the first dielectric layer.

2. The micro-LED of claim 1, wherein a geometric weighted mean distance between the side surface of the opening of the first dielectric layer and the side surface of the second type semiconductor layer is greater than or equal to 1 µm.

3. The micro-LED of claim 1, wherein the first type semiconductor layer has a resistance $\rho_1$ and a thickness $t_1$, the second type semiconductor layer has a resistance $\rho_2$ and a thickness $t_2$, and $$\sqrt{\frac{t_2}{\rho_2}} < \sqrt{\frac{t_1}{\rho_1}}.$$

4. The micro-LED of claim 1, wherein the first type semiconductor layer is an n type semiconductor layer, and the second type semiconductor layer is a p type semiconductor layer.

5. The micro-LED of claim 1, wherein the current spreading length of the first type semiconductor layer is over 20 times greater than the current spreading length of the second type semiconductor layer.

6. The micro-LED of claim 1, further comprising:
a second dielectric layer disposed on the first type semiconductor layer, the second dielectric layer having at least one opening therein to expose at least one part of the first type semiconductor layer, wherein a second shortest distance between an edge of the opening of the second dielectric layer and a side surface of the first type semiconductor layer is greater than or equal to 1 µm; and
a second electrode partially disposed on the second dielectric layer and electrically coupled with the exposed part of the first type semiconductor layer through the opening of the second dielectric layer.

7. The micro-LED of claim 1, wherein the first type semiconductor layer has a resistance $\rho_1$ and a thickness $t_1$, the second type semiconductor layer has a resistance $\rho_2$ and a thickness $t_2$, and $$\sqrt{\frac{t_1}{\rho_1}} < \sqrt{\frac{t_2}{\rho_2}}.$$

8. The micro-LED of claim 1, wherein the first type semiconductor layer is a p type semiconductor layer, and the second type semiconductor layer is an n type semiconductor layer.

9. The micro-LED of claim 1, wherein the number of the opening of the first dielectric layer is in a range from 1 to 1000.

10. The micro-LED of claim 1, wherein the area of the opening of the first dielectric layer viewed in a direction normal to the first dielectric layer occupies 2.5%-90% of the total area of the first dielectric layer viewed in the direction normal to the first dielectric layer.

11. The micro-LED of claim 1, wherein the first dielectric layer partially covers a major surface of the second type semiconductor layer distal to the first type semiconductor layer.

12. The micro-LED of claim 11, wherein the first dielectric layer at least partially covers the side surface of the second type semiconductor layer.

13. The micro-LED of claim 12, further comprising:
an active layer disposed between the first type semiconductor layer and the second type semiconductor layer, wherein the first dielectric layer at least partially covers a side surface of the active layer.

14. The micro-LED of claim 13, wherein the first dielectric layer at least partially covers a side surface of the first type semiconductor layer.

15. The micro-LED of claim 1, further comprising:
a second electrode at least partially disposed on the first type semiconductor layer, such that at least the first type semiconductor layer and the second type semiconductor layer are disposed between the first electrode and the second electrode.

16. The micro-LED of claim 1, further comprising:
an active layer disposed between the first type semiconductor layer and the second type semiconductor layer, wherein a combination of the first type semiconductor layer, the active layer, the second type semiconductor layer, and the first dielectric layer with the opening is a solid with at least two planes.

17. The micro-LED of claim 16, wherein the combination of the first type semiconductor layer, the active layer, the second type semiconductor layer, and the first dielectric layer with the opening is a cylinder, a polyhedron, or a trapezoidal solid.

18. The micro-LED of claim 1, wherein the number of the opening of the first dielectric layer is one, two, or three.

19. The micro-LED of claim 1, wherein a plurality of the openings of the first dielectric layer have the same shape.

20. The micro-LED of claim 1, wherein a plurality of the openings of the dielectric layer have different shapes.

* * * * *